(12) United States Patent
Kundu et al.

(10) Patent No.: US 7,036,063 B2
(45) Date of Patent: Apr. 25, 2006

(54) GENERALIZED FAULT MODEL FOR DEFECTS AND CIRCUIT MARGINALITIES

(75) Inventors: Sandip Kundu, Austin, TX (US); Sanjay Sengupta, San Jose, CA (US); Dhiraj Goswami, Austin, TX (US)

(73) Assignee: Intel Corporation, Santa Clara, CA (US)

(*) Notice: Subject to any disclaimer, the term of this patent is extended or adjusted under 35 U.S.C. 154(b) by 441 days.

(21) Appl. No.: 10/256,678

(22) Filed: Sep. 27, 2002

(65) Prior Publication Data

US 2004/0064773 A1 Apr. 1, 2004

(51) Int. Cl.
G01R 31/28 (2006.01)
G01R 31/30 (2006.01)
G06F 11/00 (2006.01)
G07F 11/00 (2006.01)

(52) U.S. Cl. .............. 714/741; 714/33; 714/37; 714/745

(58) Field of Classification Search .............. 714/25, 714/37, 724, 741, 32, 33, 745
See application file for complete search history.

(56) References Cited

U.S. PATENT DOCUMENTS

| | | | |
|---|---|---|---|
| 5,546,408 A | | 8/1996 | Keller |
| 5,548,715 A | * | 8/1996 | Maloney et al. .............. 714/28 |
| 6,170,078 B1 | * | 1/2001 | Erle et al. ....................... 716/4 |
| 6,202,181 B1 | * | 3/2001 | Ferguson et al. ........... 714/724 |
| 6,536,007 B1 | * | 3/2003 | Venkataraman ............. 714/724 |
| 6,553,329 B1 | * | 4/2003 | Balachandran .............. 702/118 |
| 6,789,223 B1 | * | 9/2004 | Fetherson .................... 714/738 |
| 6,836,856 B1 | * | 12/2004 | Blanton ........................ 714/25 |

OTHER PUBLICATIONS

Exploiting Dominance and Equivalence Using Fault Tuples Dwarakanath, K.N.; Blanton, R.D. VLSI Test Symposium, 2002. (VTS 2002). Proceedings 20th IEEE, 2002 pp. 269-274.

Universal Fault Simulation Using Fault Tuples Dwarakanath, K.N.; Blanton, R.D. Design Automation Conference, 2000. Proceedings 2000, 2000 pp. 786-789.

Blanton, R.D. (Shawn) et al., "The Input Pattern Fault Model and Its Application", Proceedings of the 1997 European Design and Test Conference, p. 628 (Mar. 17-20, 1997).

(Continued)

*Primary Examiner*—Albert Decady
*Assistant Examiner*—Esaw Abraham
(74) *Attorney, Agent, or Firm*—Cindy T. Faatz (57) ABSTRACT

A generalized fault model. For one aspect, extracted faults may be modeled using a fault model in which at least one of the following is specified: multiple fault atoms, two or more impact conditions for a first set of excitation conditions, a relative priority of fault atoms within a set of fault atoms used to model the at least one extracted fault, a dynamic fault delay, and excitation conditions including at least a first mandatory excitation condition and at least a second optional excitation condition.

24 Claims, 4 Drawing Sheets

OTHER PUBLICATIONS

Blanton, R.D. (Shawn) et al., "Properties of the Input Pattern Fault Model", Proceedings of the 1997 International Conference on Computer Design, pp. 372-380 (Oct. 12-15, 1997).

Kolpekwar, Abhijeet et al., "MEMS Fault Model Generation using CARAMEL", Proceedings of the IEEE International Test Conference 1998, pp. 557-566, (Oct. 18-23, 1998).

Dwarakanath, Kumar N. et al., "Universal Fault Simulation using Fault Tuples", Proceedings of the 37th Conference on Design Automation, pp. 786-789 (Jun. 5-9, 2000).

Blanton, R.D. (Shawn) et al., "Fault Tuples in Diagnosis of Deep-Submicron Circuits", Proceedings of the IEEE International Test Conference 2002, pp. 233-241 (Oct. 7-10, 2002).

* cited by examiner

GENERALIZED FAULT MODEL FOR DEFECTS AND CIRCUIT MARGINALITIES

BACKGROUND

1. Field

An embodiment of the present invention relates to the field of integrated circuit fault modeling and more particularly, to a generalized fault model to model random defects and circuit marginalities.

2. Discussion of Related Art

Defects in semiconductor chips are typically modeled as faults with binary behavior for the purposes of generating or grading manufacturing tests. Conventional fault models include the static stuck-at or dynamic transition fault models. These conventional fault models may have several limitations.

For example, certain defective behaviors may manifest only when certain other electrical conditions are satisfied. Because conventional fault models do not provide for a separation of the cause and effect of a test, they may be inadequate to model such defective behaviors.

Additionally, the above-described fault models cannot be used to model defects that manifest at different locations over time depending on the excitation conditions.

For another example, the amount of delay induced in a coupled net may vary depending on the number of aggressor lines involved. The conventional fault models do not provide a straightforward way to refine tests to improve their quality for such a situation.

Further, for some situations, it may be desirable to rank the defective behaviors based on the quality of the test(s) obtained by targeting them. Traditional static stuck-at and dynamic transition fault models do not provide a straightforward way to encode an ordering of a group of defective behaviors such that the detection of one defective behavior is sufficient to detect the fault.

As a final example, dynamic faults are typically activated at a certain phase of the system clock and the fault effect captured by a downstream latch in a future (but not necessarily the next) clock phase. In a design with multiple clock frequencies, the activation-to-capture interval can be different for each clock domain, and at domain interfaces. The conventional dynamic transition fault model(s) does not provide a way to encode the transition delay in terms of number of clock phases to ensure capture at a downstream latch.

With these limitations in mind, it's also important to consider that test generation for the above-described conventional models is a well-researched topic and many tools exist to generate tests on large industrial designs. It is desirable, for any newly proposed fault models, to allow for the development of test generation tools using well-known algorithms.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for generalized fault modeling is described. In the following description, particular types of software modules, development tools, computer systems and integrated circuits are described for purposes of illustration. It will be appreciated, however, that other embodiments are applicable to other types of software modules, development tools, computer systems and/or integrated circuits configured in another manner.

For one embodiment, a generalized fault model is provided that uses one or more fault atoms to model a fault. Each fault atom specifies one or more excitation-impact pairs. The described generalized fault model of one embodiment provides for the specification of multiple impact sites for a given set of excitation conditions and/or multiple fault effects at the same fault site at different times. Also, for some embodiments, where multiple fault atoms are specified for a single fault, the fault atoms may be prioritized with respect to each other for the purposes of subsequent test pattern development. Further, for some embodiments, where it is desirable to model a dynamic fault, a dynamic fault delay may be specified such that accurate simulation and/or test generation is enabled even for sequential circuits that include clock gating and/or multiple clock frequencies. Additionally, for some embodiments, in addition to mandatory conditions required to excite a fault, optional conditions that increase the fault effect may be specified to improve resulting test quality.

The generalized fault model of exemplary embodiments provides one or more of the above-described features to provide flexibility in modeling faults while also enabling the use of conventional test pattern generation and fault simulation algorithms.

Details of these and other embodiments are provided in the description that follows.

Figure 1:
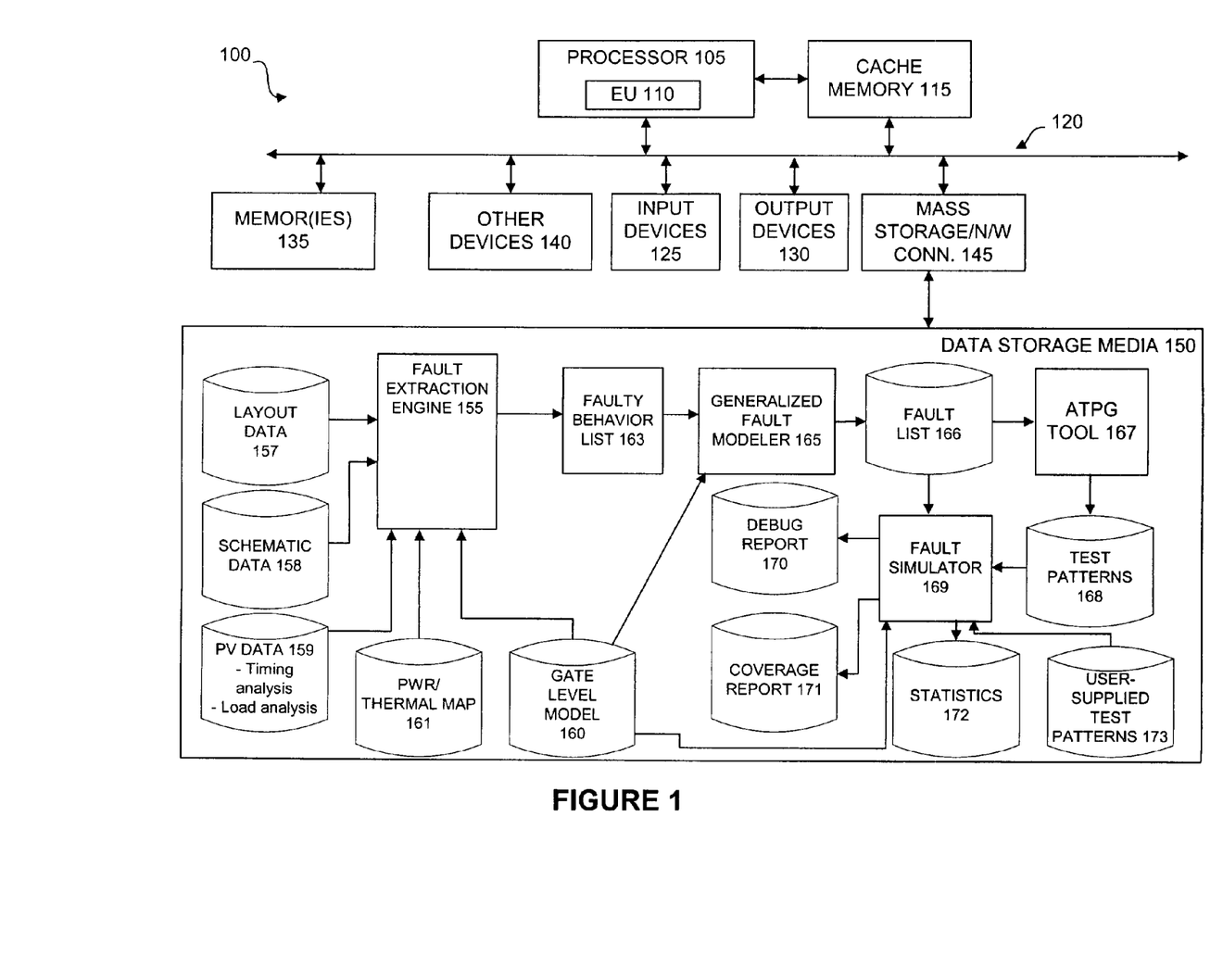
FIG. 1 is a block diagram of an exemplary system in which the generalized fault modeling method and/or apparatus of some embodiments may be advantageously used.

FIG. 1 is a block diagram of a computer system 100 in which the generalized fault modeling method and apparatus of one embodiment may be advantageously implemented. For this embodiment, the computer system 200 may be a personal computer system running one of a LINUX or Windows™ operating system. (Windows operating systems are provided by Microsoft Corporation of Redmond, Wash.) Other types of computers and/or computer systems and/or computer systems running other types of operating systems are within the scope of various embodiments.

The computer system 100 includes a processor 105 to execute instructions using an execution unit 110. A cache memory 115 may be coupled to or integrated with the processor 105 to store recently and/or frequently used instructions. The processor 105 is coupled to a bus 120 to communicate information between the processor 105 and other components in the computer system 100.

For one embodiment, the processor 105 is a microprocessor. For other embodiments, however, the processor may be a different type of processor such as, for example, a microcontroller, a digital signal processor, etc.

Also coupled to the bus 120 are one or more input devices 125, such as a keyboard and/or a cursor control device, one or more output devices 130, such as a monitor and/or printer, one or more memories 135 (e.g. random access memory (RAM), read only memory (ROM), etc.), other devices 140 (e.g. memory controller, graphics controller, bus bridge, etc.), and one or more mass storage devices and/or network connectivity devices 145.

The mass storage device(s) and/or network connectivity devices 145 may include a hard disk drive, a compact disc read only memory (CD ROM) drive, an optical disk drive and/or a network connector to couple the computer system 100 to one or more other computer systems or mass storage devices over a network, for example. Further, the mass storage device(s) 145 may include additional or alternate mass storage device(s) that are accessible by the computer system 100 over a network (not shown).

A corresponding data storage medium (or media) 150 (also referred to as a computer-accessible storage medium) may be used to store instructions, data and/or one or more programs to be executed by the processor 100. For one embodiment, the computer-accessible storage medium (or media) 150 stores information, instructions and/or programs 155-173 that, when executed by the processor 100 or another machine, are used to perform generalized fault modeling and related actions in accordance with one or more embodiments.

For the exemplary embodiment shown in FIG. 1, for example, a fault extraction engine 155 is included to extract systematic and random defects and circuit marginalities based on input data related to an integrated circuit design. In operation, the extraction engine 155 receives layout data 157, schematic data 158, performance verification (PV) data 159 and/or a gate level model 160, each associated with an integrated circuit design to be analyzed. For some embodiments, the extraction engine 155 may also receive a two-dimensional power and/or thermal dissipation map 161.

Responsive to the input data, the extraction engine 155 generates a list 163 of potential sources of faulty behaviors such as faults, systematic and/or random defects and/or circuit marginalities, for example. The output of the extraction engine 155 is referred to herein as a faulty behavior list 163 and/or as a defect/marginality list. Each of the entries in the faulty behavior list 163 may be referred to herein as a fault or extracted fault, although some entries may more properly be considered to be marginalities related to performance degradation, for example.

The faulty behavior list 163 may indicate possible faults such as bridge faults, stuck-at faults, dynamic faults, etc. The faulty behavior list 163 of one embodiment may indicate potential faults in order of importance based on user-defined or other criteria.

The faulty behavior list 163 may then be provided to a fault modeler 165. For the embodiment shown in FIG. 1, the fault modeler 165 is a generalized fault modeler as described in more detail below. The generalized fault modeler 165 models the identified faults such that the fault information can be used by a fault simulator 169 to simulate the faults and/or by an automatic test pattern generation (ATPG) tool 167 to generate test patterns to test for the faults. Such models may also or alternatively be used during design verification or other design-related activities, for example.

For one embodiment, responsive to the faulty behavior list 163, gate-level model information 160, and, in some cases, to user input via one or more input device(s) 125, the generalized fault modeler 165 provides a fault list 166 at an output. The fault list 166 is provided to the ATPG tool 167, which generates test patterns 168 responsive to the fault list 166. For one embodiment, as described in more detail below, the ATPG tool may generate test vectors that cause the specified mandatory excitation conditions and/or test vectors that cause both mandatory and optional excitation conditions. The ATPG tool 167 may be any type of ATPG tool that can accept as input the fault list 166 with the features described below. For one embodiment, the ATPG tool 167 uses conventional test pattern generation algorithms with only minor modifications to be able to operate on the fault list 166 with the below-described features.

With continuing reference to FIG. 1, the test patterns 168, along with the fault list 166 and the gate level model 160 are provided to the fault simulator 169. The fault simulator 169, like the ATPG tool 167, may be any fault simulator that can accept as input the fault list 166 with the below-described features. Alternatively or additionally, user-supplied test patterns 173, which may include, for example, manually written test patterns and/or patterns generated with manual assistance, may also be provided to the fault simulator 169.

The fault simulator 169 then produces an associated debug report 170, coverage report 171 and/or statistics 172 for one embodiment. The debug report 170 may be used to access intermediate data related to the internal operations of the fault simulator to provide insight into its activity. The coverage report 171 indicates test coverage for the integrated circuit of interest using the test patterns 168 and/or 173, and the statistics 172 are generated to report on frequency of occurrence of various internal states during simulation. Such information may include signal toggle count, toggle interval, fault activation count, fault activation vectors, faulty state count, first and last fault excitation and/or a fault propagation report.

It will be appreciated by one of ordinary skill in the art that, while FIG. 1 represents the data storage media 150 as a single block, for many embodiments, multiple data storage media may be used to store the information and/or instructions 155–173 and/or some of the information and/or instructions indicated by the blocks 155–173 may be accessible by computer system 100 over a network (not shown) or via a signal received by the computer. Further, it will be appreciated that not all of the information and/or instructions 155–173 may be included or used for all embodiments and that, for some embodiments, additional information and/or instructions may be included. Also, while the system 100 of FIG. 1 is a computer system, the system 100 may be a different type of electronic system for other embodiments.

The generalized fault modeler 165 and a method for generalized fault modeling in accordance with one embodiment are now described in more detail in reference to FIGS. 2–6.

Figure 2:
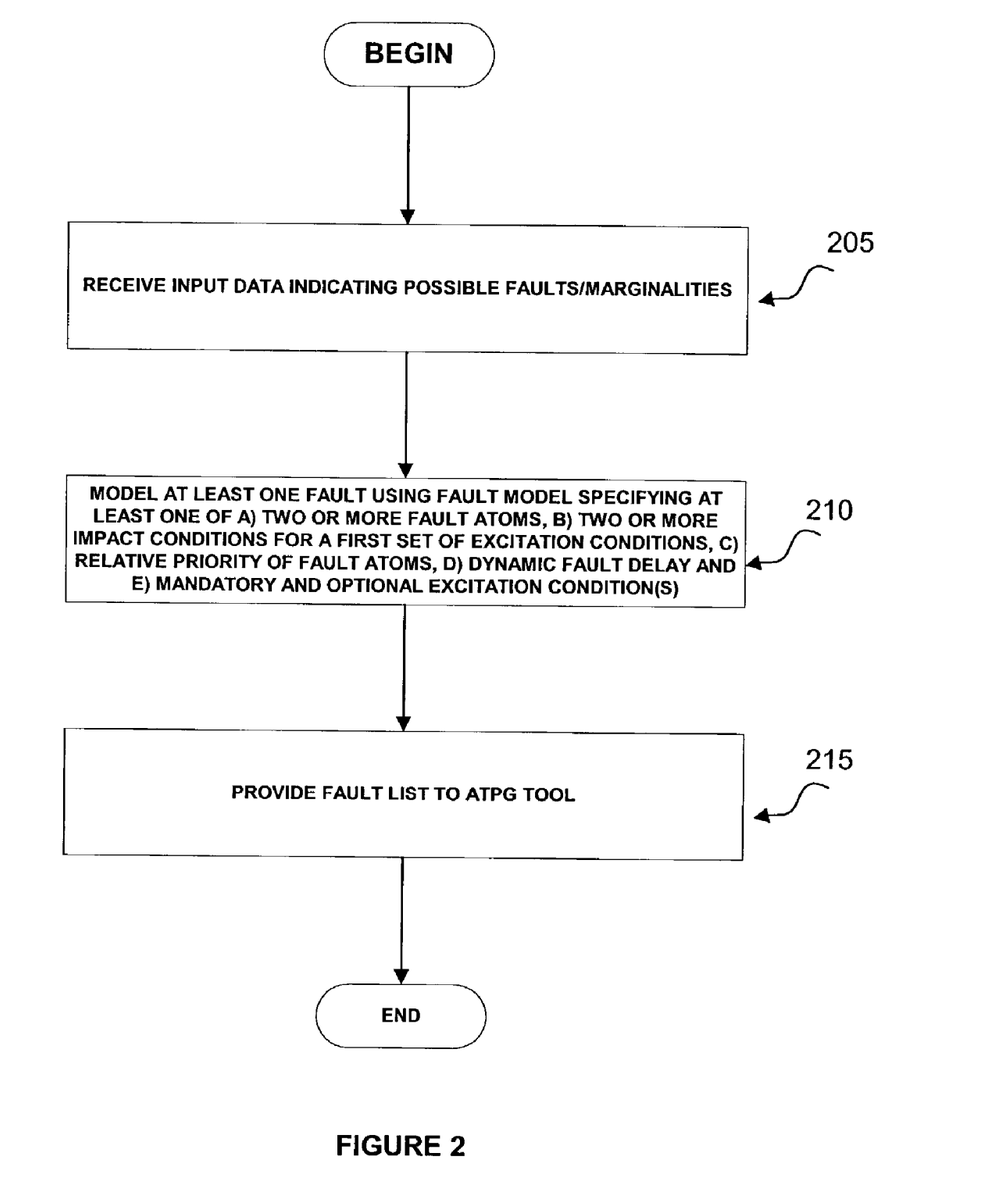
FIG. 2 is a flow diagram showing a method for generalized fault modeling of one embodiment.

FIG. 2 is a high-level flow diagram showing a method of one embodiment for modeling faults and marginalities associated with an integrated circuit design. At block 205, input data indicating possible faults and/or circuit marginalities (both referred to herein as faults) associated with an integrated circuit design are received. At block 210, at least one of the faults is modeled using a fault model in which at least one of the following is specified: a) two or more fault atoms, b) two or more impact conditions for a first set of excitation conditions, c) a relative priority of fault atoms within a set of fault atoms used to model the at least one fault, d) a dynamic fault delay, and e) excitation conditions including at least a first mandatory excitation condition and at least a second optional excitation condition.

Optionally, at block 215, a fault list including the modeled faults may be provided to an automatic test pattern generator (ATPG) tool to generate associated test patterns and/or to a different tool, such as a design verification tool, that may make use of the fault models. The ATPG tool may generate test vectors that cause the mandatory excitation conditions and/or test vectors that cause the mandatory and/or optional excitation conditions for faults for which both are specified.

It will be appreciated that, for other embodiments, additional actions may be included and/or one or more actions shown in FIG. 2 may not be included.

A generalized fault model of one embodiment provides the flexibility to specify one or more of the above-described attributes using fault atoms. Each fault atom includes a set of excitation-impact pairs that indicate excitation condition (s) and associated impact(s) for a given fault.

Excitation conditions describe the node and/or net values that would cause a faulty behavior for a given fault. For static fault behavior, the node and/or net value may be indicated as a single value representing the logic state of the indicated node or net that excites the respective fault. For a dynamic fault, two values may be indicated to represent the type of transition that causes the related faulty behavior. For example, the excitation condition A=01 may indicate a rising transition on a signal line A.

Each excitation condition includes at least one mandatory condition and may additionally include one or more optional conditions. Mandatory conditions indicate conditions that must all be met in order for the fault to manifest, while optional conditions describe ways to increase the magnitude of the associated fault effect. A set of test vectors that satisfies mandatory and optional excitation conditions may provide a superior test as compared to a set of test vectors that only satisfies the mandatory excitation conditions.

An impact specified in a fault atom describes the nature of the associated fault effect. The impact indicates a fault site (typically a node or net) and an induced fault effect—either static or dynamic. Static faults behave like a stuck-at-zero fault or a stuck-at-one fault so long as the associated excitation conditions persist. Dynamic faults behave like a slow-to-rise or slow-to-fall fault if the signal at the fault site is transitioning high or low, respectively, and the excitation conditions continue.

For dynamic faults, a delay parameter may be specified and indicates the delay between a signal transition in a good circuit and a signal transition in a circuit that includes the targeted fault. The delay parameter of one embodiment is specified in terms of a number of clock phases, but other delay units may be used for other embodiments.

An exemplary syntax for the generalized fault model of one embodiment is provided below:

```
Fault ::= fault_atom {fault_atom}
fault_atom ::= excitation_impact {excitation_impact}
excitation_impact ::= [excitation_list] impact_list
excitation_list ::= mandatory_conditions [optional_conditions]
mandatory_conditions ::= condition_list
optional_conditions ::= condition_list {condition_list}
condition_list ::= condition {condition}
condition ::= pin_name|net_name = value
value ::= binary_digit[binary_digit]
binary_digit ::= 0|1|X|Z
impact_list ::= impact {impact}
```

```
impact ::= pin_name fault_effect {delay}
fault_effect ::= static_effect|dynamic_effect
static_effect ::= stuck-at-0|stuck-at-1
dynamic_effect ::= slow-to-rise|slow-to-fall delay
delay ::= <integer>
```

For other embodiments, a different syntax may be used to provide the capabilities set forth in the claims below.

Referring now to FIGS. 3–6, examples are provided to illustrate the manner in which the generalized fault model of various embodiments may be used to model some exemplary fault types.

Figure 3:
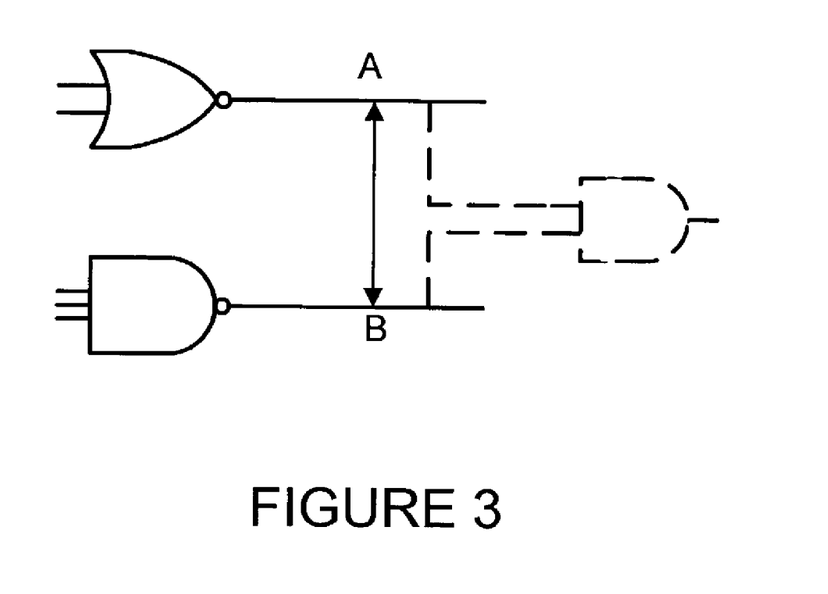
FIG. 3 is a schematic diagram illustrating the behavior of a first fault type that may be modeled using the generalized fault modeling approach of one embodiment.

FIG. 3 shows a schematic representation of the behavior of an exemplary static-AND bridge fault. In this example, two nets (A and B) are bridged together in such a way that their behavior resolves to an AND function of the logic values on the nets. Using the generalized fault model of one embodiment, this fault may be modeled as follows:

```
Begin Fault Atom 1
    {Excitation: (A=0, B=1); Impact: (B stuck-at-0)}
    {Excitation: (A=1, B=0); Impact: (A stuck-at-0)}
End Fault Atom 1;
```

For this example, the static-AND bridge fault is modeled using one fault atom including two excitation-impact pairs. It will be appreciated that, in a sequential test, different excitation conditions may appear in different clock phases leading to different impacts. It is possible for both impacts to be excited in the same test although not at the same time.

Figure 4:
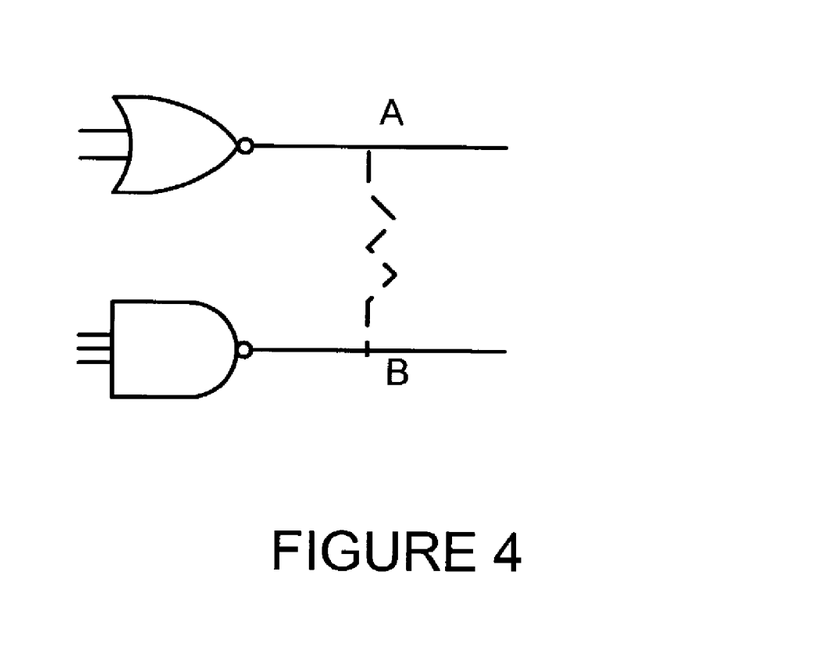
FIG. 4 is a schematic diagram illustrating the behavior of a second fault type that may be modeled using the generalized fault modeling approach of one embodiment.

Referring now to FIG. 4, where a bridge between nets A and B is instead resistive in nature, the bridge may cause a signal delay, for example, on a rising transition at one wire if the other wire is at a logic 0 level (an example of a dynamic fault). For purposes of this example, it is further assumed that the signal transition delay is equivalent to two clock phases (or two other time frames). An exemplary fault having the behavior illustrated in FIG. 4 may be described for one embodiment of the generalized fault model in the following manner:

```
Begin Fault Atom 1
    {Excitation: (A=00, B=01); Impact: (B slow-to-rise, delay=2)}
    {Excitation: (A=01, B=00); Impact: (A slow-to-rise, delay=2)}
End Fault Atom 1;
```

For this example, using the delay parameter as shown above where the delay is specified in terms of clock phases as compared to a properly performing circuit, fault behavior may be more accurately modeled for sequential circuits where clock gating and/or multiple clock domains are used as compared to prior approaches. In this manner, simulation and/or test generation accuracy may also be improved.

Figure 5:
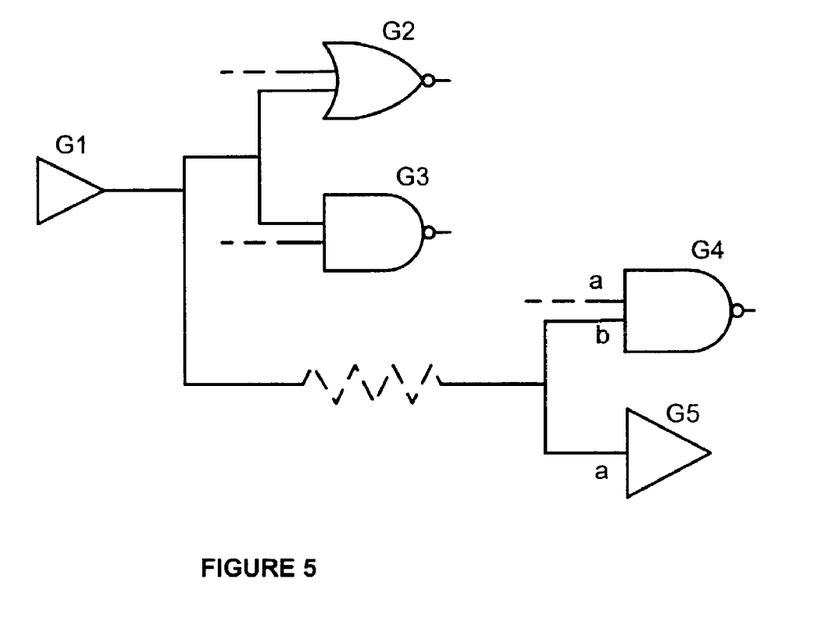
FIG. 5 is a schematic diagram illustrating the behavior of a third fault type that may be modeled using the generalized fault modeling approach of one embodiment.
Figure 6:
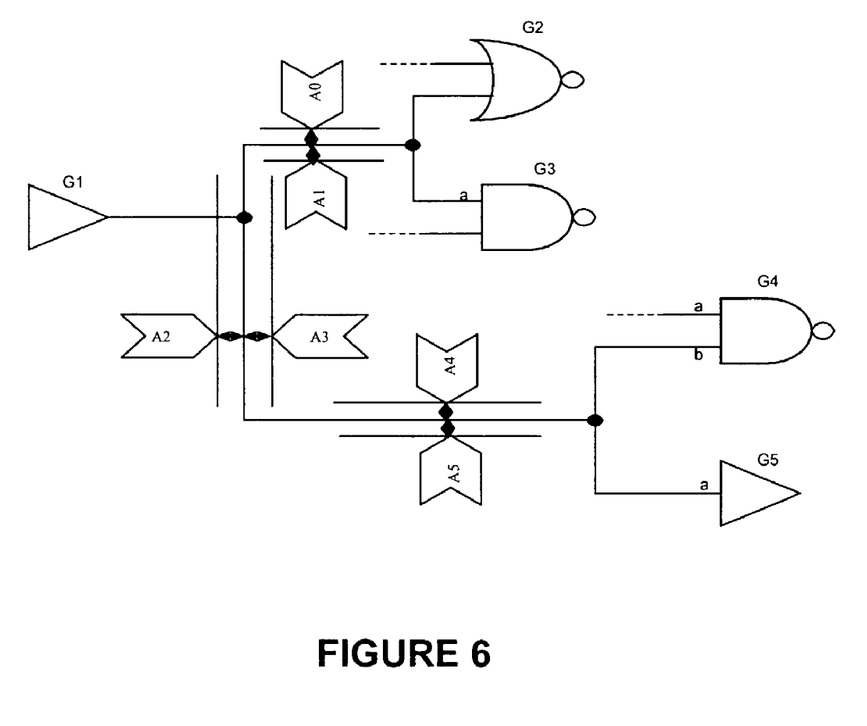
FIG. 6 is a schematic diagram illustrating the behavior of a fourth fault type that may be modeled using the generalized fault modeling approach of one embodiment.

FIG. 5 illustrates the behavior of an exemplary resistive open defect that may arise, for example, due to an improperly formed via. The exemplary resistive open defect illustrated in FIG. 4 affects some of the fanouts of the gate G1. The impact of the exemplary fault is to slow down signal transition on the inputs of G4 and G5 due to increased interconnect (resistive-capacitive (RC)) delay. The delay for purposes of this example is four clock phases or other unit delays. This fault may be represented in the following manner using the generalized fault model of one embodiment, where G1 indicates the output of the gate G1, G4/*b* indicates the b input of the gate G4 and G5/*a* indicates the input of the gate G5:

```
Begin Fault Atom 1
    {Excitation: (G1=01); Impact: (G4/b slow-to-rise, delay=4), G5/a
        slow-to-rise, delay=4)}
    {Excitation: (G1=10); Impact: (G4/b slow-to-fall, delay=4), (G5/a
        slow-to-fall, delay=4)}
End Fault Atom 1;
```

As shown in this example, in accordance with one embodiment, multiple fault sites may be specified for a single set of excitation conditions. This capability may enable more accurate modeling of fault behavior as compared to prior approaches.

FIG. 5 is a schematic illustrating the behavior of an exemplary cross-talk fault. For this example, capacitively-coupled lines are indicated by a line with an arrowhead on each end and drivers are indicated by an arrow-like shape as shown.

A typical signal line may have multiple sinks. A noise spike on a signal line, however, may impact only a subset of multiple sinks associated with the signal line. Further, a failure/delay push out/signal hazard may be excited even when fewer than all the potential aggressors are active. This type of faulty behavior may be modeled as indicated below in accordance with the generalized fault model of one embodiment. In the example below, reference indicators associated with drivers and/or gates (e.g. G1, A2, etc.) are used to represent their respective outputs while a reference indicator and a lower case letter together (e.g. G5/*a*) are used to represent the indicated input of a gate.

```
Begin Fault Atom 1
    {Excitation: (G1=01, A2=10, A3=10, A4=10, A5=10);
        Optional Excitation: (A0=10, A1=01);
        Impact: (G4/b slow-to-rise, delay=2), (G5/a slow-to-rise, delay=2)}
    {Excitation: (G1=10, A2=01, A3=01, A4=01, A5=01);
        Optional Excitation: (A0=01, A1=01);
        Impact: (G4/b slow-to-fall, delay=2), (G5/a slow-to-fall, delay=2)}
End Fault Atom 1;
Begin Fault Atom 2
    {Excitation: (G1=01, A0=10, A1=10, A2=10, A3=10);
        Optional Excitation: (A4=10, A5=01);
        Impact: (G3/a slow-to-rise, delay=2)}
    {Excitation: (G1=10, A0=01, A1=01, A2=01, A3=01);
        Optional Excitation: (A4=01, A5=01);
        Impact: (G3/a slow-to-fall, delay=2)}
End Fault Atom 2;
```

As illustrated in this example, optional excitation conditions may be specified to improve test quality. As described above, the specified optional excitation conditions are not necessary to excite the associated fault, but may act to increase the fault effect. Thus, test patterns that cause the mandatory excitation conditions, but not the optional excitation conditions are acceptable in terms of exciting the associated fault, but test patterns that cause both the mandatory and optional excitation conditions are superior in terms of their ability to detect the fault.

Further, as also illustrated in this example, for one embodiment, multiple fault atoms may be used to describe different ways to excite a fault. Where multiple fault atoms are specified to model a fault as in the example above, for one embodiment, the fault atoms may be ranked in priority with respect to one another such that test pattern development may be better targeted where desired.

For one embodiment, the order in which the fault atoms are specified indicates their relative priority. For other embodiments, a different approach to indicating relative priority of fault atoms may be used.

For some embodiments, multiple fault atoms may also be specified to model multiple fault effects at the same site at different times.

As described above, a generalized fault model according to some embodiments can be used to model even defects with complex characteristics. Embodiments of the described generalized fault model provide for decoupling of cause and effect and the ability to describe defects with multiple fault sites or multiple fault effects at the same fault site at different times. For some embodiments, optional excitation conditions may also be specified to improve test quality.

Further, by providing the capability to use multiple fault atoms, different ways of exciting a fault may be specified. These multiple fault atoms can be ranked such that corresponding test vector generation can be prioritized where desired.

Further, using the above-described generalized fault model, delay parameters may be specified to enable accurate simulation and/or test generation even for sequential circuits where clock gating and/or multiple clock frequencies are used.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A computer-implemented method for modeling integrated circuit faults comprising:
   receiving a list of extracted faults; and
   modeling at least one of the extracted faults by specifying at least one of the following:
      a) two or more impact conditions for a first set of excitation conditions,
      b) a dynamic fault delay, and
      c) excitation conditions including at least a first mandatory excitation condition and at least a second optional excitation condition.

2. The method of claim 1 wherein modeling further comprises:
   specifying multiple fault atoms for at least one of the extracted faults, each of at least two of the multiple fault atoms to describe different excitation conditions from each other.

3. The method of claim 2 further comprising:
   indicating a relative priority of the multiple fault atoms with respect to each other.

4. The method of claim 1 wherein modeling further comprises:
   specifying multiple fault atoms for at least one of the extracted faults, each of at least two of the multiple fault atoms to model different fault effects at a same site at different times.

5. The method of claim 1, wherein
   modeling includes using a fault model for which cause and effect are decoupled.

6. The method of claim 1, wherein
modeling comprises specifying an impact condition by indicating at least a first fault site and an induced fault effect.

7. The method of claim 6, wherein
specifying a dynamic fault delay comprises specifying a number of clock phases associated with a delay.

8. A method comprising:
modeling at least one fault in a faulty behavior list associated with an integrated circuit design by specifying at least one of:
   a) two or more fault atoms;
   b) two or more impact conditions for a first set of excitation conditions,
   c) a relative priority of fault atoms where more than one fault atom is included,
   d) a dynamic fault delay, and
   e) excitation conditions including at least a first mandatory excitation condition and at least a second optional excitation condition; and
generating an associated test pattern in response to receiving the modeled fault.

9. The method of claim 8 wherein
generating an associated test pattern includes generating an associated test pattern that causes the at least first mandatory excitation condition specified in at least one fault atom.

10. The method of claim 8 wherein
generating an associated test pattern includes generating associated test patterns that cause both the mandatory excitation condition and at least one optional excitation condition specified in at least one fault atom.

11. A machine-readable storage medium storing data that, when executed by a machine, causes the machine to:
model at least one of a plurality of extracted faults related to an integrated circuit design by specifying at least one of:
   a) two or more impact conditions for a first set of excitation conditions,
   b) a dynamic fault delay, and
   c) excitation conditions including at least a first mandatory excitation condition and at least a second optional excitation condition.

12. The machine-readable storage medium of claim 11 further storing data that, when executed by the machine, causes the machine to:
model at least one of a plurality of extracted faults using multiple fault atoms.

13. The machine-readable storage medium of claim 12, wherein
at least two of the multiple fault atoms specify different excitation conditions.

14. The machine-readable storage medium of claim 12, wherein
at least two of the multiple fault atoms specify different impacts at the same site at different times.

15. The machine-readable storage medium of claim 12 further storing data that, when executed by the machine, causes the machine to:
prioritize the multiple fault atoms.

16. The machine-readable storage medium of claim 11, wherein the dynamic fault delay is specified in terms of a number of clock phases.

17. An apparatus comprising:
a generalized fault modeler to output a model of at least one extracted fault associated with an integrated circuit design, the model to specify at least one of:
   a) two or more impact conditions for a first set of excitation conditions,
   b) a dynamic fault delay, and
   c) excitation conditions including at least a first mandatory excitation condition and at least a second optional excitation condition.

18. The apparatus of claim 17, wherein the model specifies multiple fault atoms.

19. The apparatus of claim 18, wherein the model indicates a relative rank of the multiple fault atoms.

20. A computer-implemented method for generating test patterns comprising:
generating a first test pattern to satisfy a mandatory excitation condition specified in a fault model associated with a first extracted fault; and
generating a second test pattern to satisfy an optional excitation condition specified in the fault model, the optional excitation condition to improve a quality of a test to identify the first extracted fault.

21. The method of claim 20 further comprising:
generating a set of test patterns including the first and second test patterns in response to receiving a fault model associated with the first extracted fault, the fault model specifying at least one of:
   a) two or more impact conditions for a first set of excitation conditions,
   b) a dynamic fault delay, and
   c) excitation conditions including at least a first mandatory excitation condition and at least a second optional excitation condition.

22. A system comprising:
a bus;
a processor coupled to the bus; and
a memory, the memory to store data that, when executed by the processor, cause the system to:
   model at least a first extracted fault associated with an integrated circuit design by specifying at least one of:
      a) two or more impact conditions for a first set of excitation conditions,
      b) a dynamic fault delay, and
      c) excitation conditions including at least a first mandatory excitation condition and at least a second optional excitation condition.

23. The system of claim 22 wherein the model further specifies:
multiple fault atoms.

24. The system of claim 23 wherein the model further specifies:
a relative priority of the multiple fault atoms.

* * * * *